(12) United States Patent
Takagi

(10) Patent No.: US 9,035,469 B2
(45) Date of Patent: May 19, 2015

(54) SEMICONDUCTOR DEVICE THAT CONTROLS A NEGATIVE RESISTIVE OSCILLATION AND OBTAINS A HIGH AMPLIFICATION OUTPUT

(71) Applicant: KABUSHIKI KAISHA TOSHIBA, Minato-ku (JP)

(72) Inventor: Kazutaka Takagi, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/026,343

(22) Filed: Sep. 13, 2013

(65) Prior Publication Data

US 2014/0252658 A1    Sep. 11, 2014

(30) Foreign Application Priority Data

Mar. 6, 2013    (JP) ................. 2013-044616

(51) Int. Cl.
*H01L 23/48* (2006.01)
*H01L 23/52* (2006.01)
*H01L 29/40* (2006.01)
*H01L 23/00* (2006.01)

(52) U.S. Cl.
CPC ......... *H01L 24/42* (2013.01); *H01L 2924/1306* (2013.01)

(58) Field of Classification Search
CPC .. H01L 23/49; H01L 24/42; H01L 2924/1306
USPC .......................................... 257/784
See application file for complete search history.

(56) References Cited

U.S. PATENT DOCUMENTS

| | | |
|---|---|---|
| 2011/0018631 A1 | 1/2011 | Ng et al. |
| 2012/0199847 A1 | 8/2012 | Takagi |
| 2013/0120069 A1 | 5/2013 | Takagi |

FOREIGN PATENT DOCUMENTS

| | | |
|---|---|---|
| JP | 2010-81249 | 4/2010 |
| JP | 2013-70403 A | 4/2013 |

*Primary Examiner* — Stephen W Smoot
*Assistant Examiner* — Vicki B Booker
(74) *Attorney, Agent, or Firm* — Oblon, McClelland, Maier & Neustadt, L.L.P.

(57) ABSTRACT

A semiconductor device has a field effect transistor (FET), a mounting member, an output matching circuit board, a relay board, and first and second bonding wire. The FET includes plural cell regions arranged dispersedly and plural drain terminal electrodes connected to each cell region. The output matching circuit board is provided between an output conductive part and the FET, and has a first insulating substrate and a conductive part. A relay board is provided between the output matching circuit board and the FET. The relay board includes a second insulating substrate having a permittivity lower than a permittivity of the second insulating substrate of the output matching circuit board, and which has a relay conductive part on an upper surface of the second insulating substrate.

5 Claims, 10 Drawing Sheets

US 9,035,469 B2

SEMICONDUCTOR DEVICE THAT CONTROLS A NEGATIVE RESISTIVE OSCILLATION AND OBTAINS A HIGH AMPLIFICATION OUTPUT

CROSS-REFERENCE TO RELATED APPLICATION

This application is based upon and claims the benefit of priority from the prior Japanese Patent Application No. 2013-044616, filed on Mar. 6, 2013, the entire contents of which are incorporated herein by reference.

FIELD

An embodiment of a present invention relate to a semiconductor device.

BACKGROUND

A field effect transistor which comprises compound semiconductor may operate as a diode which has a negative resistance.

For example, if Gunn oscillation of several tens of GHz is produced, an amplification output at desired frequency decreases.

If an operation layer is divided into a plurality of cell regions and a drain terminal electrode is also divided into a plurality, each drain terminal electrode will be in the state where load is connected, and thereby it becomes easy to control a negative resistance oscillation between adjacent cell regions.

However, dividing a cell region may cause uneven operation.

DETAILED EMBODIMENT

Figure 1:
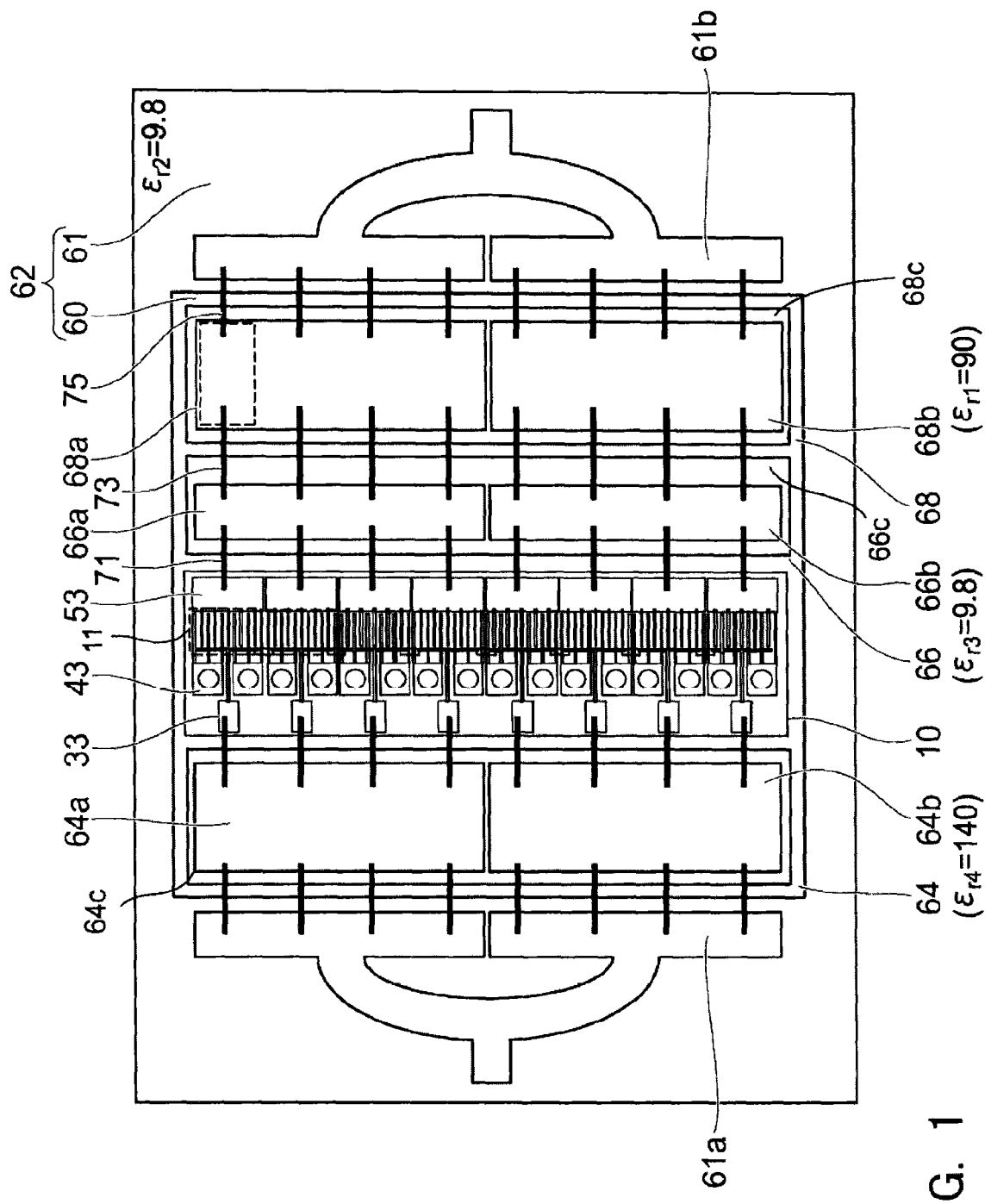
FIG. 1 is a schematic top view of a semiconductor device concerning an embodiment.

An example of the present invention provides a semiconductor device in which a negative resistance oscillation is controlled and which is easy to obtain a high amplification output.

A semiconductor device of an embodiment has a field effect transistor, a mounting member, an output matching circuit board, a relay board, first bonding wires, second bonding wires, and third bonding wires. The field effect transistor has a plurality of cell regions arranged dispersedly. An operation current of the cell region is controlled by a multi-finger electrode provided on an operation layer which produces a negative resistance with two conduction bands which different electron speeds. The field effect transistor has a plurality of drain terminal electrodes connected to each cell region. The mounting member has an input conductive part and an output conductive part. The output matching circuit board has a first insulating substrate and a conductive part on an upper surface of the first insulating substrate, and is provided between the output conductive part and the field effect transistor. The relay board is provided between the output matching circuit board and the field effect transistor, has a second insulating substrate having a permittivity lower than a permittivity of the first insulating substrate of the output matching circuit board, and has a relay conductive part on an upper surface of second insulating substrate. A plurality of first bonding wires connects the plurality of drain terminal electrodes and the relay conductive part. The second bonding wire connects the relay conductive part and the conductive part of the output matching circuit board. The third bonding wire connects the conductive part of the output matching circuit board and the output conductive part. At least two first bonding wires are connected to the relay conductive part and thereby are bundled in common.

Hereinafter, the embodiment of the present invention is described, referring to the drawings.

FIG. 1 is a schematic top view of a semiconductor device concerning the embodiment. The semiconductor device has a field effect transistor 10, such as an HEMT (High Electron Mobility Transistor), a mounting member 62, an input matching circuit board 64, a relay board 66, and an output matching circuit board 68.

The mounting member 62 has a base plate 60, a frame part 61 which is provided on the base plate 60 and consists of insulation material, and an input conductive part 61a and an output conductive part 61b which are provided on a surface of the frame part 61. The base plate 60 consists of metal, such as copper which has high-heat conductivity. The frame part 61 consists of insulation material, such as alumina ($Al_2O_3$).

The input matching circuit board 64 is provided between the input conductive part 61a and the field effect transistor 10. In addition, the relay board 66 and the output matching circuit board 68 are provided in this order from the semiconductor device 10 and between the output conductive part 61b and the field effect transistor 10. The input matching circuit board 64 has an insulating substrate 64c and a conductive pattern 64a (herein after, it is called a conductive part) which is provided on an upper surface of the insulating substrate 64c and serves as a matching circuit, for example. The relay board 66 has an insulating substrate 66c, and a conductive pattern 66a and 66b (hereinafter, it is called a conductive part) which is provided on an upper surface of the insulating substrate 66c. The output matching circuit board 68 has an insulating substrate 68c and a conductive pattern 68a and 68b (hereinafter, it is called a conductive part) which is provided on an upper surface of the insulating substrate 68c and serves as a matching circuit, for example. The output matching circuit board 68, first bonding wires 71, second bonding wires 73, and third bonding wires 75 adjust an output impedance of the field effect transistor 10 with an impedance of an external line with which the output conductive part 61b connects. The shape of matching circuit, sum of the length of the first bonding wires 71 and the second bonding wires 73, and the length of the third bonding wires 75 are determined by the output impedance of the field effect transistor 10. The input matching circuit board 64, the relay board 66 and the output matching circuit board 68 are bonded to the base plate 60. The output impedance of the field effect transistor 10 is 0.5+j1.0 (ohm), for example.

A relative permittivity ∈r1 of the insulating substrate 68c which constitutes the output matching circuit board 68 is higher than a relative permittivity ∈r2 of the insulation material which constitute the frame part 61, and is higher than a relative permittivity ∈r3 of the insulating substrate 66c which constitutes the relay board 66. That is, a permittivity of the insulating substrate 68C which constitutes the output matching circuit board 68 is higher than a permittivity of the insulation material which constitutes the frame part 61, and is higher than a permittivity of the insulating substrate 66C which constitutes the relay board 66. The relative permittivity ∈r1 of the insulating substrate 68c which constitutes the output matching circuit board 68 can be set to 90, for example. Alumina etc. can be used as the insulation material which constitutes the frame part 61. The relative permittivity of alumina is 9.8, for example. In addition, alumina etc. can be used as the insulating substrate 66c which constitutes the relay board 66.

First input side bonding wires connect the input conductive part 61a on the mounting member 62 and conductive parts 64a and 64b of the input matching circuit board 64. Second input side bonding wires connect the conductive parts 64a and 64b of the input matching circuit board 64 and the field effect transistor 10.

The first bonding wires 71 connect the field effect transistor 10 and conductive parts 66a and 66b of the relay board 66. The second bonding wires 73 connect the conductive parts 66a and 66b of the relay board 66 and conductive parts 68a and 68b of the output matching circuit board 68. As the first bonding wire 71 and the second bonding wire 73, one continuous bonding wire may be used which uses the relay conductive part 66a or 66b on the surface of the relay board 66 as a relay point. The third bonding wires 75 connect the conductive parts 68a and 68b of the output matching circuit board 68 and the output conductive part 61b. At least two first bonding wires 71 are connected to the relay conductive part 66a, and thereby are bundled in common. In addition, at least two first bonding wires 71 are connected to the relay conductive part 66b, and thereby are bundled in common. In FIG. 1, four first bonding wires 71 are connected to the relay conductive part 66a, and thereby are bundled in common. In addition, four first bonding wires 71 are connected to the relay conductive part 66b, and thereby are bundled in common.

Figure 2:
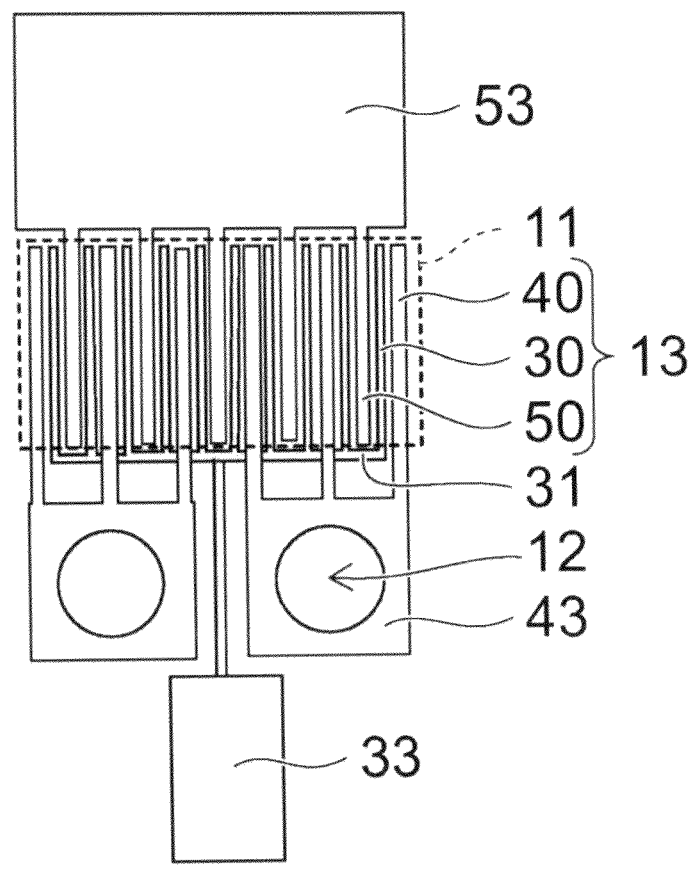
FIG. 2 is a schematic top view of a cell region of the semiconductor device of the embodiment.

FIG. 2 is a schematic top view of a cell region. The field effect transistor 10 has eight cell regions 11. In each cell region 11, a current is controlled by a multi-finger electrode structure formed on an operation layer which consists of semiconductor with which has a negative (differentia) resistance. For example, a multi-finger electrode 13 has a plurality of finger gate electrodes 30, a plurality of finger drain electrodes 50 and a plurality of finger source electrodes 40. The finger drain electrode 50 and the finger source electrode 4 are formed so as to sandwich each finger gate electrode 30. Each finger gate electrode 30 is connected to gate bus-line 31. The gate bus-line 31 is connected to gate terminal electrode 33. FIG. 2 shows the cell region 11 by a dashed line. In FIG. 1, the field effect transistor 10 has eight drain terminal electrodes 53, eight gate terminal electrodes 33, and sixteen source terminal electrodes 43. Note that the source terminal electrodes 43 are connected to the ground in common using via holes 12. In the cell region 11, the gate terminal electrode 33 is connected with the plurality of finger gate electrodes 30, and the source terminal electrodes 43 are connected with the plurality of finger source electrodes 40, and the drain terminal electrode 53 is connected with the plurality of finger drain electrodes 50. Each drain terminal electrode 53 is connected with the relay conductive part 66a or the relay conductive part 66b by the first bonding wire 71.

Figure 3:
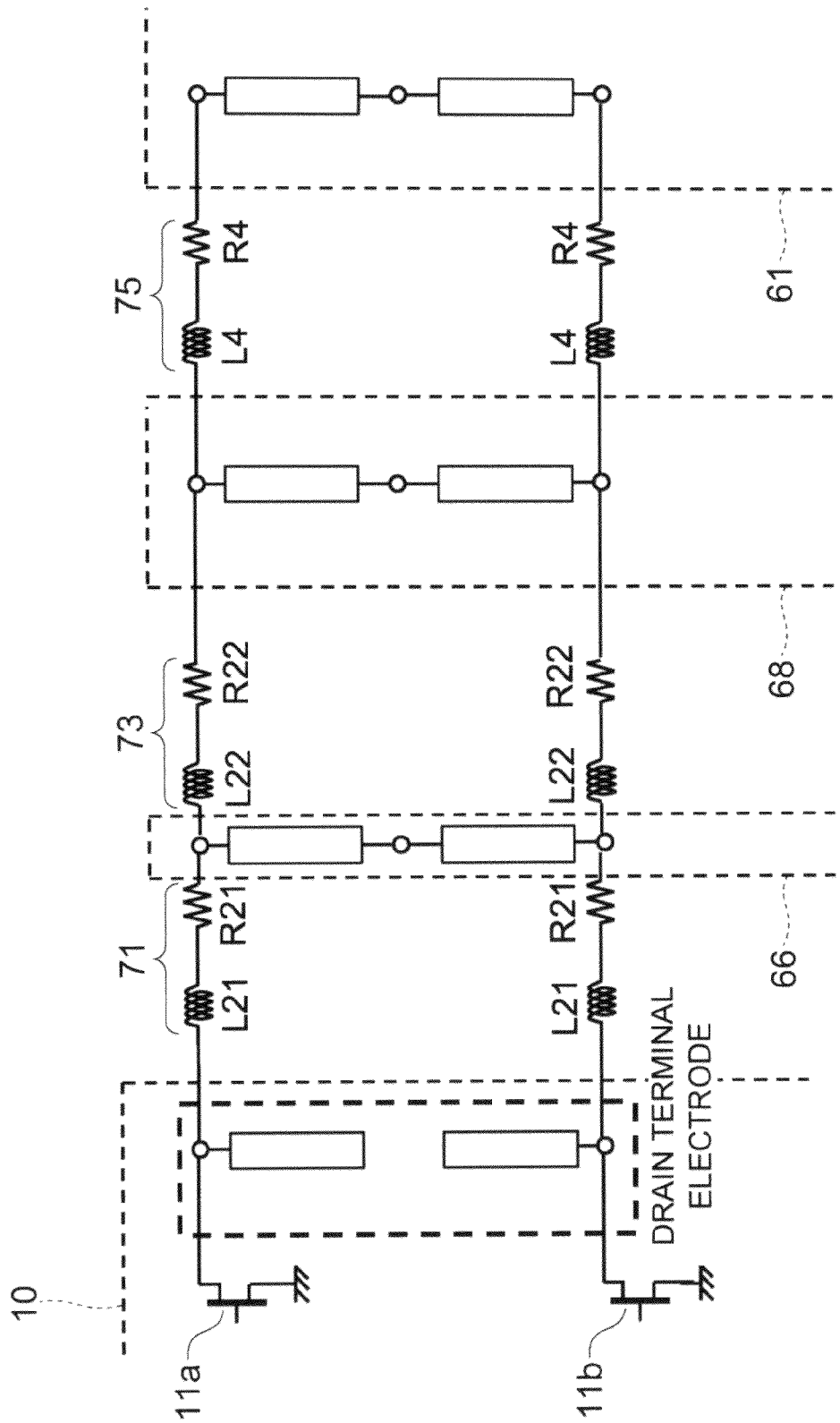
FIG. 3 is a configuration diagram of an output side circuit connected to two adjoining cell regions.

FIG. 3 is a configuration diagram of an output side circuit connected to two adjoining cell regions. The two adjoining cell regions 11a and 11b may constitute an oscillation loop. When the field effect transistor 10 is an MESFET (Metal Semiconductor Field Effect Transistor) comprising of n-type GaAs, a GaAs HEMT, an InP HEMT, etc., an energy band structure of n-type GaAs contains a lower conduction band where an electronic speed is high, and an upper conduction band where the electronic speed is low.

Figure 4:
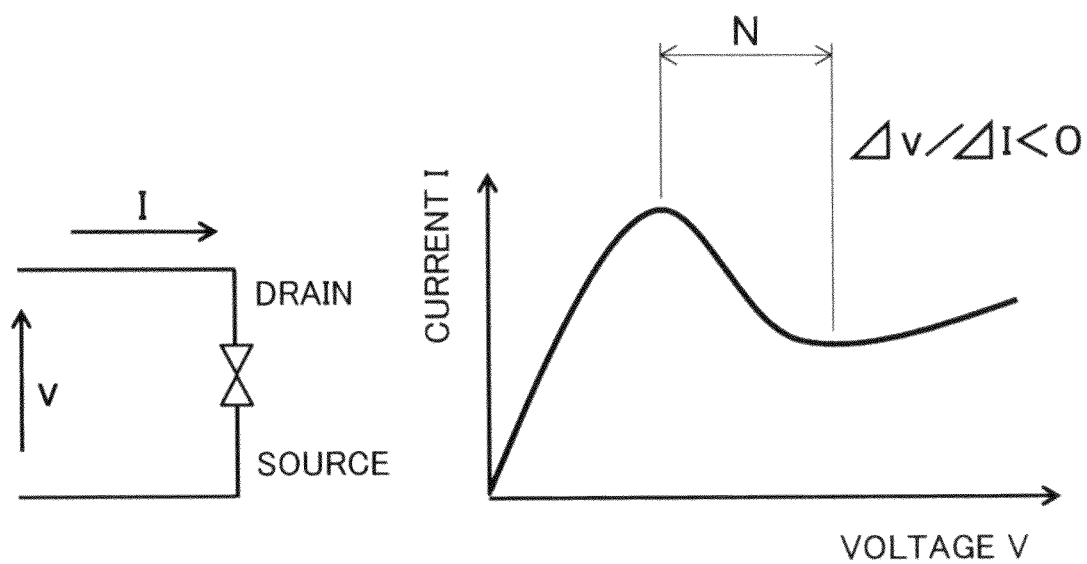
FIG. 4 shows a graph explaining a negative resistance produced with a semiconductor which has the two minimum values in a conduction band of energy band structure.

FIG. 4 shows a graph explaining a negative resistance produced by a semiconductor which has two minimum values in a conduction band of energy band structure. When a region between a drain and a source of the field effect transistor 10 operates as a diode, a voltage-current characteristic produces a negative (differentia) resistance region N because of two conduction bands with which the electronic speeds differ. When a negative resistance produced in the diode is set to Zd and a load connected to the diode is set to ZL, a conditions for a negative resistance oscillation is Zd+ZL<=0. That is, the field effect transistor 10 which can amplify a signal in x band may produce a Gunn oscillation at a millimeter wave band.

Figure 5:
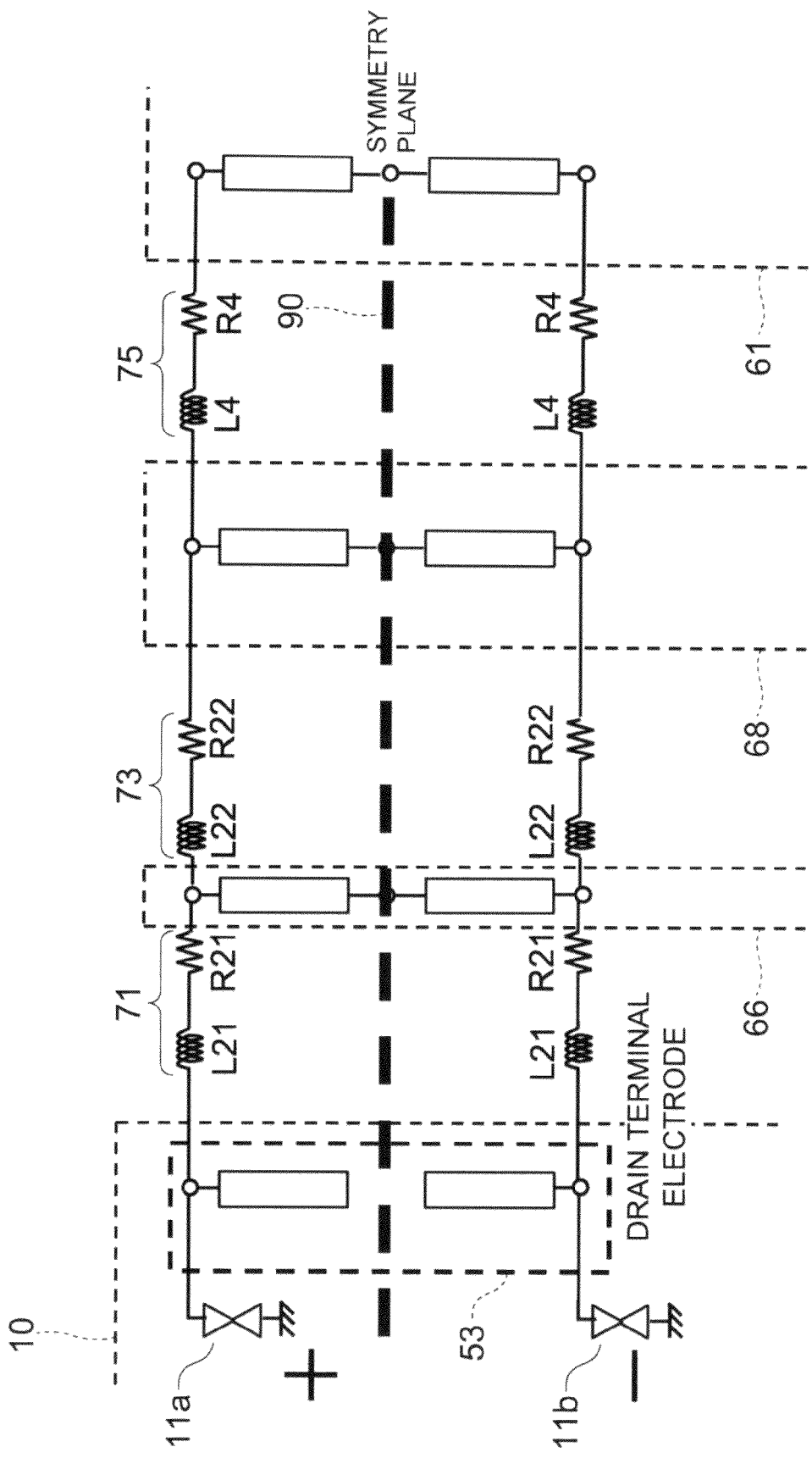
FIG. 5 is a circuit configuration diagram explaining a symmetry plane in a negative oscillation produced between two cells.

FIG. 5 is a circuit configuration diagram explaining a symmetry plane in the negative oscillation produced between two cell regions. When the oscillation is produced between the two cell regions 11a and 11b, the two cell regions 11a and 11b operate in a negative phase mutually. In this case, since the symmetry plane 90 is seen as an electric wall, the symmetry plane 90 becomes equivalent to the ground, for example in the millimeter wave band which is a negative resistance oscillating frequency.

Figure 6:
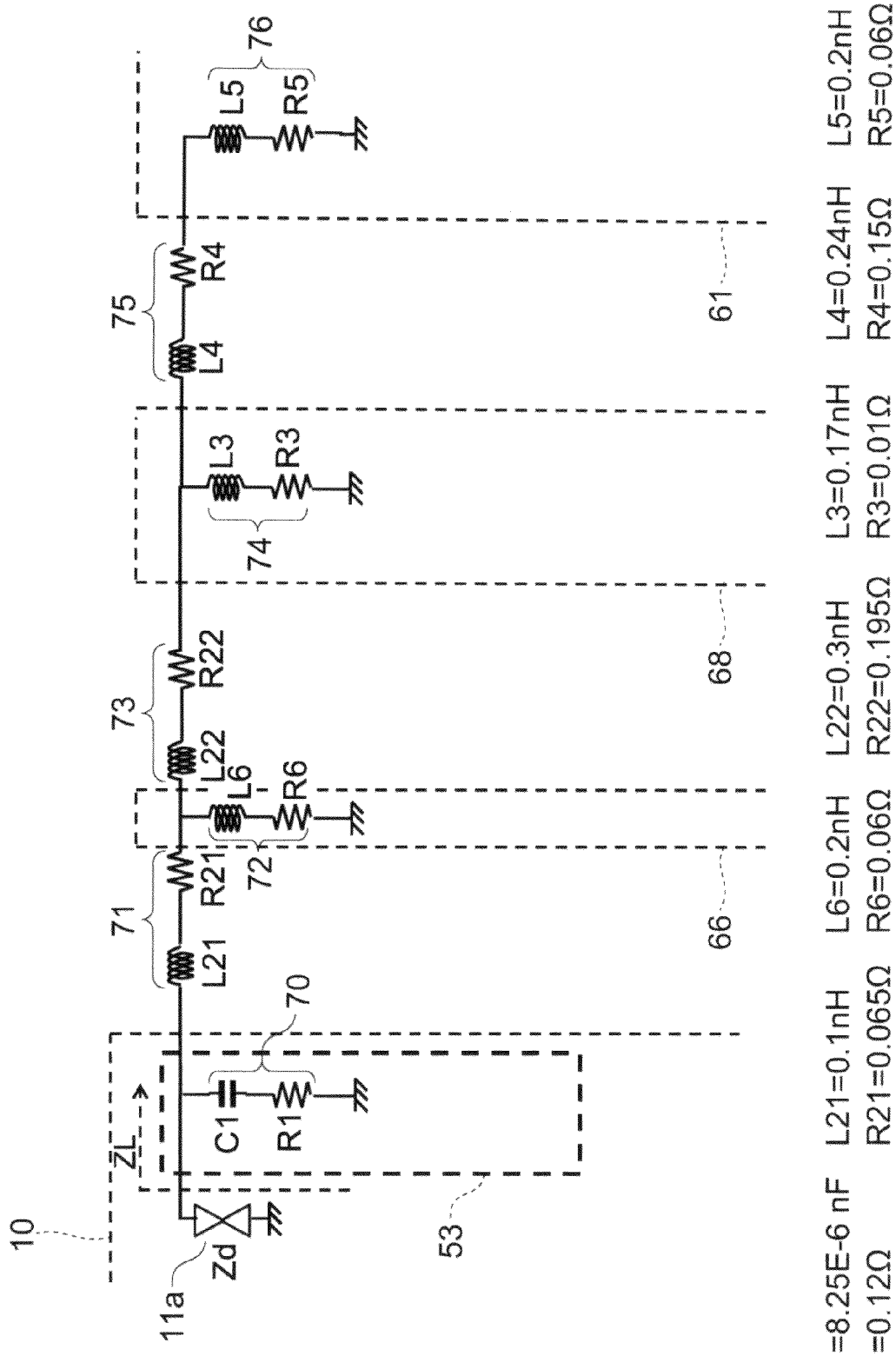
FIG. 6 is a circuit configuration diagram of one cell region which is grounded in equivalent.

FIG. 6 is a circuit configuration diagram of the negative resistance oscillation of one cell region where a symmetry plane is considered as an equivalent ground. Since the first bonding wire 71, the second bonding wire 73 and the third bonding wire 75 produce conductor (copper etc.) loss at the negative resistance oscillating frequency, they have resistance ingredient R21, R22 and R4, respectively. Each of the conductive part 68a of the output matching circuit board 68 which connects the cell region 11a and the cell region 11b, and the output conductive part 61b on the mounting member 62 is shorter than a quarter wavelength. For this reason, each short stub functions as an inductance. On the other hand, the divided drain terminal electrode 53 is shorter than a quarter wavelength. For this reason, an open stub functions as a capacitance. The load ZL of the diode can be expressed by a formula (1) at this time.

$$ZL = \cfrac{1}{1/(1/j\omega C1 + R1) + \cfrac{1}{(j\omega L21 + R21) + \cfrac{1}{1/(j\omega L6 + R6) + \cfrac{1}{(j\omega L22 + R22) + Y1}}}}$$ [Formula 1]

Here, $$Y1 = \frac{1}{1(j\omega L3 + R3) + 1\{j\omega(L4+L5) + R4 + R5\}}$$

and $$\omega = 2\pi f$$

Here, a frequency of the negative resistance oscillation shall be 40 GHz. As for an open stub of 50 μm in width and 100 μm in length on a GaAs substrate (relative permittivity: 12.8) whose thickness is 50 μm, an equivalent capacitance C1 is about 0.00825 pF, and a conductor loss R1 is about 0.12 ohm. A bonding wire of about 400 μm in length and 0.4 nH in inductance is used as the first bonding wire 71 and the second bonding wire 73. The first bonding wire 71 is about 100 μm in length (an inductance L21 is 0.1 nH), and the second bonding wire 73 is about 300 μm in length (an inductance L22 is 0.3 nH). The bonding wire is divided into the first bonding wire 71 and the second bonding wire 73, and the bonding wire is relayed on the relay board 66. When the bonding wire is Au wire of 30 μm in diameter, a conductor loss R21 of the first bonding wire 73 is 0.065 ohm and a conductor loss R22 of the second bonding wire 71 is 0.195 ohm. In this embodiment, the length of the first bonding wire 71 is shorter than the length of the second bonding wire 73.

The length of the first bonding wire 71 is set up so that the conductor loss of the first bonding wire 71 at a frequency of an oscillation produced by the negative resistance may become larger than an absolute value of the negative resistance. In addition, sum of the length of the first bonding wire 71 and the second bonding wire 73 is constant. The length is designed from inductance which makes impedance transfer with the output matching circuit board 68. The impedance transfer makes a matching between an output impedance of the field effect transistor 10 and impedance of the line with which the output conductive part 61b connects with. When the first bonding wire 71 becomes long, the second bonding wire 73 becomes short.

When a 254-μm-thick alumina (relative permittivity ∈r3: 9.8) is used as the insulating substrate 66c of the relay board 66, as for a short stub of 100 μm in width and 100 μm in length on the insulating substrate 66c, an equivalent inductance L6 is about 0.2 nH, and a conductor loss R6 is about 0.06 ohm.

When a 100-μm-thick high dielectric material (relative permittivity ∈r1: 90) is used as the insulating substrate 68c of the output matching circuit board 68, as for a short stub of 980 nm in width and 100 μm in length on the insulating substrate 68c, an equivalent inductance L3 is about 0.17 nH and a conductor loss R3 is about 0.01 ohm.

When an Au bonding wire which is 30 μm in diameter and 240 μm in length is used as the third bonding wire 75, an equivalent inductance L4 is 0.24 nH and a conductor loss R4 is 0.15 ohm.

When a 254-μm-thick alumina (relative permittivity ∈r2: 9.8) is used as the frame part 61 on which the output conductive part 61b is formed, as for a short stub of 100 μm in width and 100 μm in length on the frame part, an equivalent inductance L5 is about 0.2 nH and a conductor loss R5 is about 0.06 ohm.

When the above-mentioned value of each circuit constant is assigned to the formula (1), the load ZL of the diode is shown as a formula (2).

ZL=0.114+j11.79 (ohm)        Formula (2)

Here, j: Imaginary unit

Since the negative resistance Zd obtained by an experiment is −0.1 ohm, the negative resistance oscillation can be controlled. The bonding wires 71 are bundled on the relay conductive part 66a and 66b of the relay board 66, and thereby a phase difference between the bonding wires 71 is reduced. Accordingly, the plurality of cell regions 11 can operate uniformly, and thereby output combining efficiency can be raised.

Figure 7:
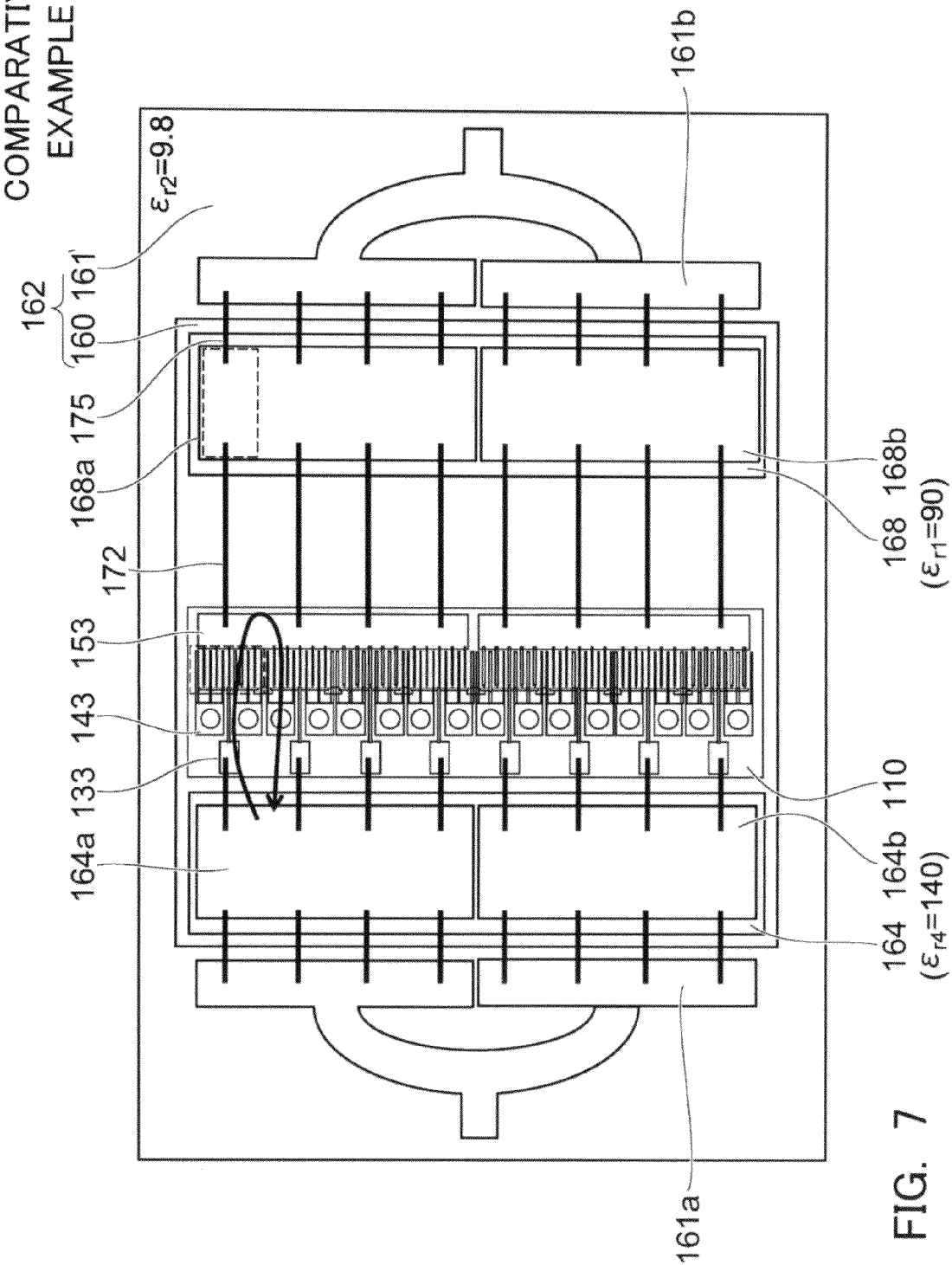
FIG. 7 is a schematic top view of a semiconductor device concerning a first comparative example.

FIG. 7 is a schematic top view of a semiconductor device concerning a first comparative example. The semiconductor device has a field effect transistor 110, such as an HEMT, a mounting member 162, an input matching circuit board 164, and an output matching circuit board 168.

The mounting member 162 has a base plate 160, a frame part 161 which is provided on the base plate 160 and consists of insulation material, and an input conductive part 161a and an output conductive part 161b which are provided on a surface of the frame part 161. The base plate 160 consists of metal, such as copper which has high-heat conductivity. The frame part 161 consists of insulation material, such as alumina.

The input matching circuit board 164 is formed between the input conductive part 161a and the field effect transistor 110. In addition, the output matching circuit board 168 are formed between the output conductive part 161b and the field effect transistor 110. The input matching circuit board 164 has an insulating substrate and a conductive pattern which is provided on an upper surface of the insulating substrate and serves as a matching circuit, for example. The output matching circuit board 168 has an insulating substrate and a conductive pattern which is provided on an upper surface of the insulating substrate and serves as a matching circuit, for example. A relative permittivity ∈r1 of the insulating substrate which constitutes the output matching circuit board 168 is higher than a relative permittivity ∈r2 of the insulation material which constitutes the frame part 161.

Bonding wires 172 connect the field effect transistor 110 and the conductive parts 168a and 168b of the output matching circuit board 168. Bonding wires 175 connect the conductive parts 168a and 168b of the output matching circuit board 168 and the output conductive part 161b on the mounting member 162. The output matching circuit board 168, bonding wires 172, and bonding wires 175 adjust an output impedance of the field effect transistor 10 with an impedance of an external line with which the output conductive part 161b connects. The shape of matching circuit, the length of the bonding wires 172, and the length of the third bonding wires 175 are determined by the output impedance of the field effect transistor 10. In the first comparative example, the four bonding wires 172 are also bundled in common on the drain terminal electrode 153, and are connected to the drain terminal electrode 153.

The field effect transistor 110 has eight cell regions 111. In each cell region 111, a current is controlled by a multi-finger electrode structure formed on an operation layer which consists of compound semiconductor. In addition, in FIG. 7, two drain terminal electrodes 153, eight gate terminal electrodes 133 and sixteen source terminal electrodes 143 are provided. Since four cell regions are bundled and are connected to the common drain terminal electrode 153, the field effect transistor 110 can perform uniform operation easily and can raise output combining efficiency.

Figure 8:
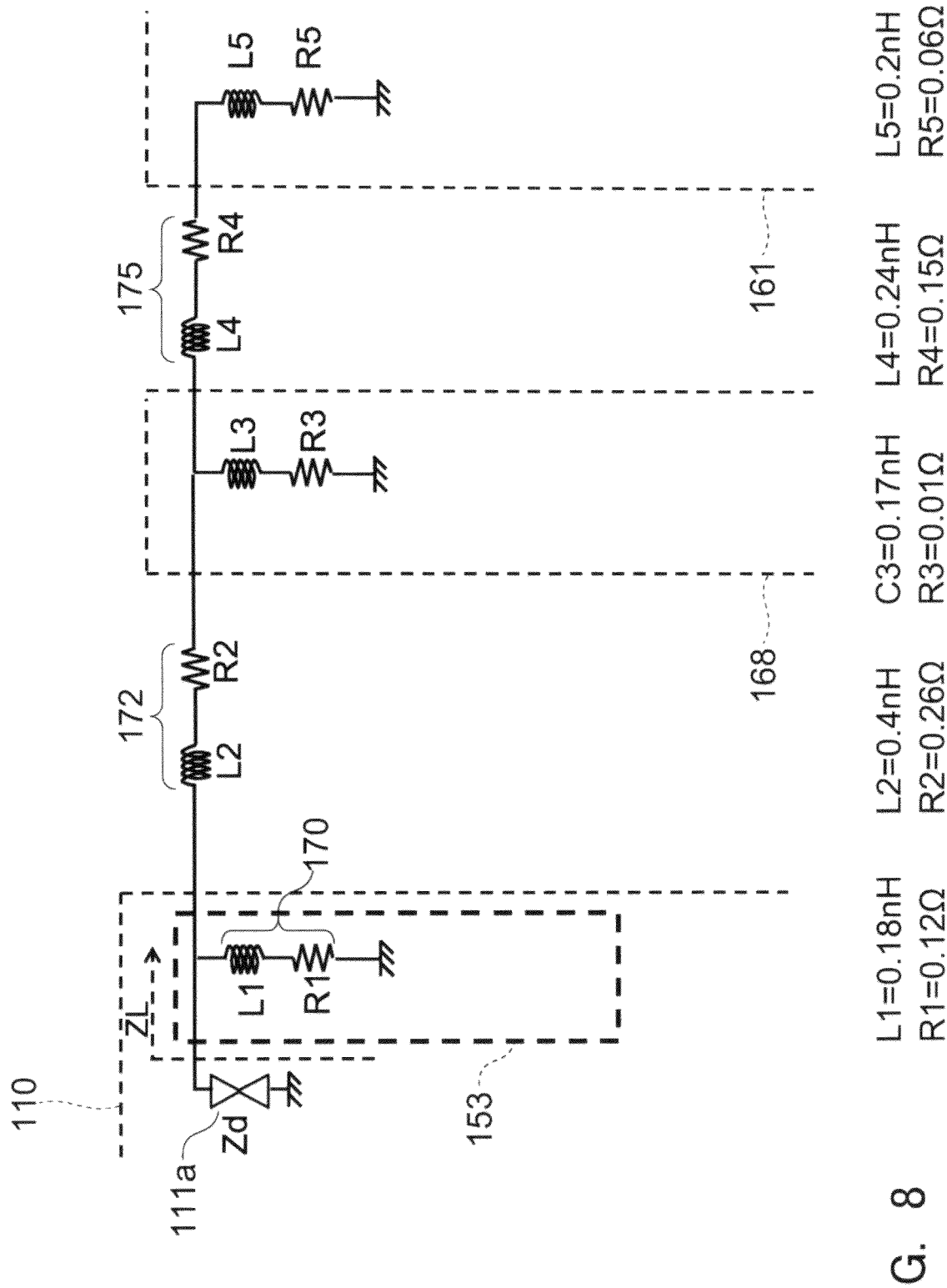
FIG. 8 is a circuit configuration diagram of one cell region which is grounded in equivalent.

FIG. 8 is a circuit configuration diagram of one cell region grounded in equivalent. Since the adjoining cell regions 111a and 111b are connected by the drain terminal electrode 153, they are grounded by a symmetry plane. That is, each of the drain terminal electrode 153, the conductive patterns 168a and 168b of the output matching circuit board 168, and the output conductive part 161b functions as a short stub.

Each of the drain terminal electrode 153 which connects the cell regions 111a and 111b, the conductive pattern 168a on the output matching circuit board 168, and the output conductive part 161b on the mounting member 162 is shorter than a quarter wavelength. For this reason, each short stub functions as an inductance. When a frequency of a negative resistance oscillation is 40 GHz, an example of a circuit constant is expressed in FIG. 8.

In addition, a load ZL of a diode can be expressed by a formula (3).

$$ZL = \cfrac{1}{1/(1/j\omega C1 + R1) + \cfrac{1}{(j\omega L2 + R2) + \cfrac{1}{1/(j\omega L3 + R3) + 1\{j\omega(L4 + L5) + R4 + R5\}}}} \quad \text{[Formula 3]}$$

Here, $\omega = 2\pi f$

When the above-mentioned value of the circuit constant is assigned to a formula (2), the load ZL of the diode is expressed by the formula (4).

$$ZL = 0.085 + j6.73 \text{ (ohm)} \quad \text{Formula (4)}$$

Here, j: Imaginary unit

Since a negative resistance Zd obtained by an experiment is about −0.1 ohm, a negative resistance oscillation may be produced.

Figure 9:
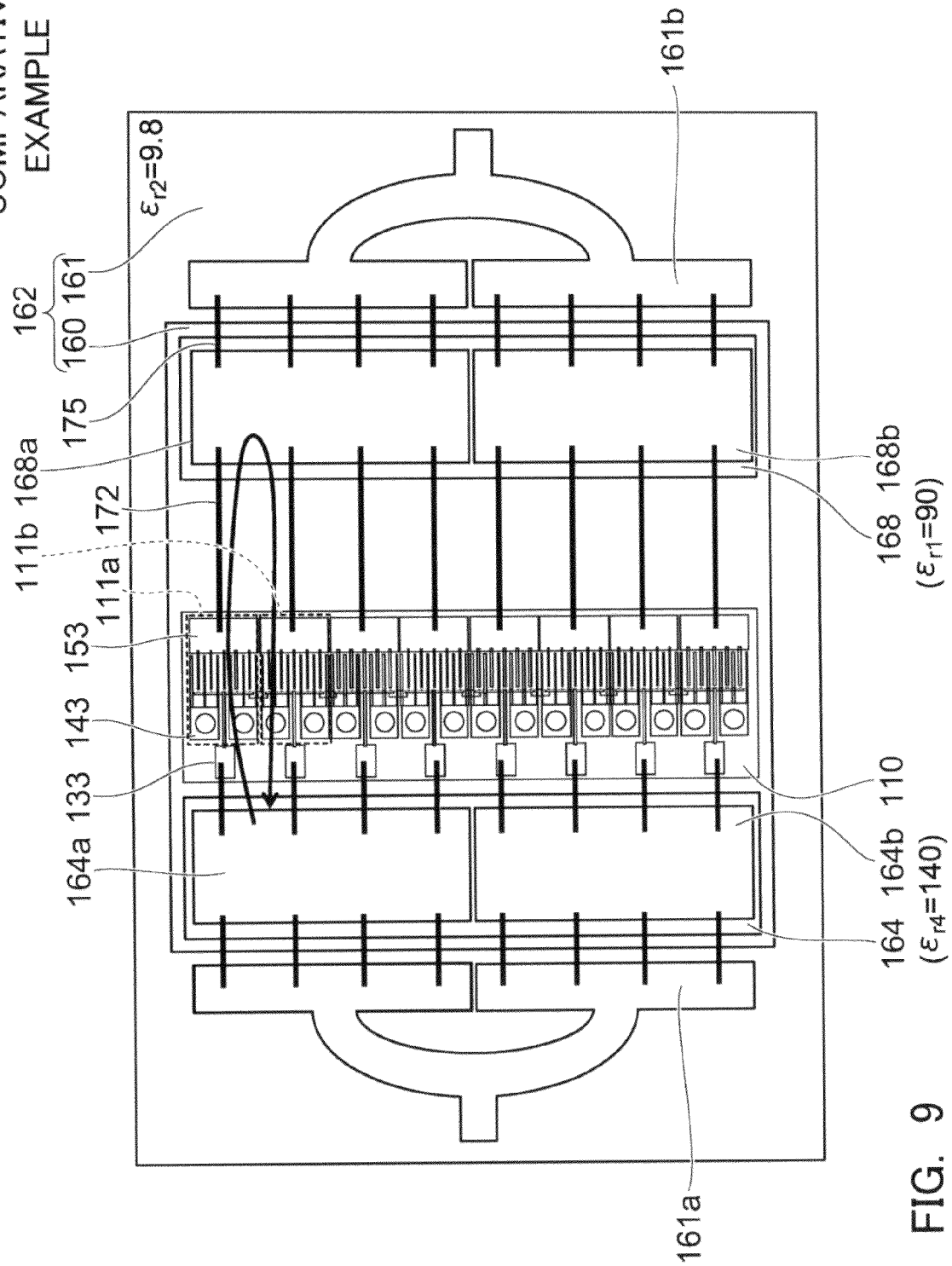
FIG. 9 is a schematic top view of a semiconductor device concerning a second comparative example.
Figure 10:
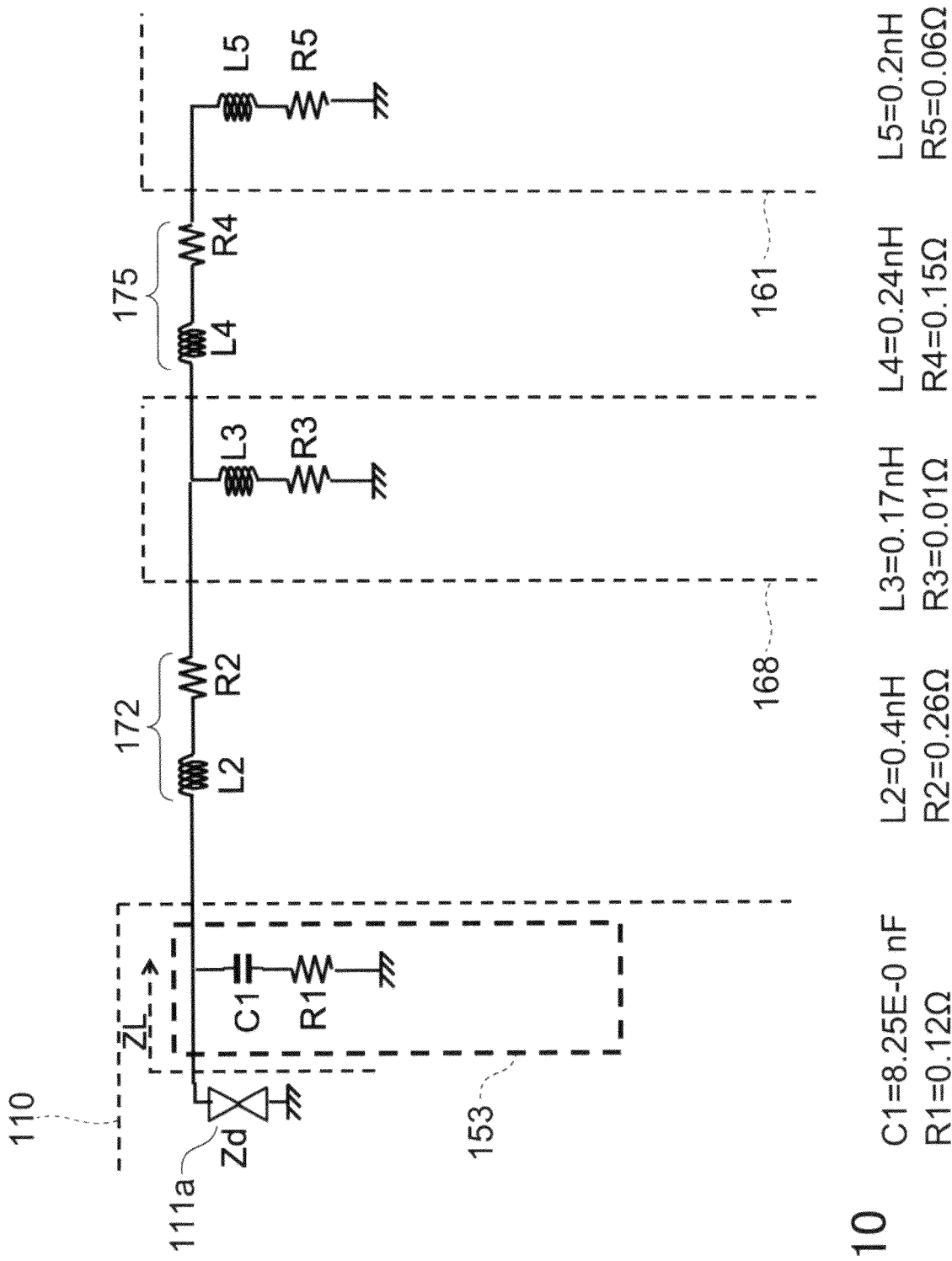
FIG. 10 is a circuit configuration diagram of one cell region which is grounded in equivalent.

FIG. 9 is a schematic top view of a semiconductor device concerning a second comparative example. FIG. 10 is a circuit configuration diagram of one cell region grounded in equivalent. As shown in FIG. 9, in the semiconductor device of the second comparative example, eight drain terminal electrodes 153 are provided and each drain terminal electrode 153 is provided for each cell region. As shown in FIG. 10, each of the conductive pattern 168a of the output matching circuit board 168 which connects the cell region 111a and the cell region 111b, and the output conductive part 161b on the mounting member 162, is shorter than a quarter wavelength. Accordingly, a short stub performs as an inductance. On the other hand, each drain terminal electrode 153 is shorter than a quarter wavelength. Accordingly, an open stub functions as a capacitance. When a frequency of a negative resistance oscillation is 40 GHz, an example of a circuit constant is shown in FIG. 10.

In this case, a load ZL of a diode is expressed by a formula (5).

$$ZL = \cfrac{1}{1/(1/j\omega C1 + R1) + \cfrac{1}{(j\omega L2 + R2) + \cfrac{1}{1/(j\omega L3 + R3) + 1\{j\omega(L4 + L5) + R4 + R5\}}}} \quad \text{[Formula 5]}$$

Here, $\omega = 2\pi f$

When the above-mentioned value of the circuit constant is assigned to the formula (5), the load ZL of the diode is expressed by a formula (6).

$$ZL = 0.275 + j25.99 \text{ (ohm)} \quad \text{Formula (6)}$$

Here, j: Imaginary unit

Thus, a value of load can be made about three times greater than the load of the first comparative example. Since the negative resistance Zd obtained by an experiment is about −0.1 ohm, a negative resistance oscillation can be controlled. However, a bonding wire 172 which connects the drain terminal electrode 153 and a conductive pattern 168a, 168b of the output matching circuit board 168 becomes long. For this reason, a phase difference arises among the eight bonding wires 172. Accordingly, each operation of the eight cell regions 111 becomes uneven, and it is difficult to raise output combining efficiency.

Compared with the first and the second comparative examples, the relay conductive parts 66a and 66b are provided between the drain terminal electrode 53 and the output matching circuit board 168 in the embodiment. The bonding wires which connect the drain terminal electrodes 53 and the conductive parts 168a, 168b of the output matching circuit board 168 are divided, relayed, and bundled by the relay conductive parts 66a and 66b of the relay board 66. For this reason, inductance ingredients of a plurality of bonding wires can be made uniform and the plurality of cell regions 11 can be operated uniformly. Thus, the semiconductor device of the embodiment can obtain a high amplification output while controlling the negative resistance oscillation.

While one embodiment has been described, this embodiment has been presented by way of example only, and is not intended to limit the scope of the invention. Indeed, the novel embodiment described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a mounting member which has an input conductive part and an output conductive part;
    a field effect transistor which has a plurality of cell regions arranged dispersedly, which has a plurality of drain terminal electrodes connected to each cell region, and which is arranged on the mounting member, wherein an operation current of each cell region is controlled by a multi-finger electrode provided on an operation layer which produces a negative resistance with two conduction bands of which electronic speeds differ each other;
    an output matching circuit board which is provided between the output conductive part and the field effect transistor, and which has a first insulating substrate and a conductive part on an upper surface of the first insulating substrate;
    a relay board which is provided between the output matching circuit board and the field effect transistor, and which has a second insulating substrate having a permittivity lower than a permittivity of the second insulating substrate of the output matching circuit board, and which has a relay conductive part on an upper surface of the second insulating substrate;

a plurality of first bonding wires which connect the plurality of drain terminal electrodes and the relay conductive part, wherein at least two first bonding wires are connected to the relay conductive part and thereby are bundled in common;

a plurality of second bonding wires which connect the relay conductive part and the conductive part of the output matching circuit board; and a plurality of third bonding wires which connect the conductive part of the output matching circuit board and the output conductive part.

2. The semiconductor device according to the claim 1, wherein an oscillation produced by the negative resistance is a Gunn oscillation.

3. The semiconductor device according to the claim 1, wherein the multi-finger electrode has at least two finger gate electrodes and finger drain electrodes and finger source electrodes which are provided so as to sandwich each finger gate electrode, and each finger gate electrode, each finger drain electrode and each finger source electrode are parallel in one cell region.

4. The semiconductor device according to the claim 1, wherein the field effect transistor, the output matching circuit board and the relay board are bonded to the mounting member.

5. The semiconductor device according to the claim 1, wherein a length of all of the first bonding wires is shorter than a length of all of the second bonding wires.

\* \* \* \* \*